(12) United States Patent
Forsberg

(10) Patent No.: US 6,864,744 B2
(45) Date of Patent: Mar. 8, 2005

(54) AMPLIFIER CIRCUIT

(75) Inventor: Gunnar Forsberg, Stockholm (SE)

(73) Assignee: Transmode Systems AB, Stockholm (SE)

( * ) Notice: Subject to any disclaimer, the term of this patent is extended or adjusted under 35 U.S.C. 154(b) by 0 days.

(21) Appl. No.: 10/433,083

(22) PCT Filed: Nov. 29, 2001

(86) PCT No.: PCT/SE01/02647
§ 371 (c)(1),
(2), (4) Date: May 30, 2003

(87) PCT Pub. No.: WO02/45260
PCT Pub. Date: Jun. 6, 2002

(65) Prior Publication Data
US 2004/0021513 A1 Feb. 5, 2004

(30) Foreign Application Priority Data
Dec. 1, 2000 (SE) .............................. 0004433

(51) Int. Cl.⁷ ................................................ H03G 3/20
(52) U.S. Cl. ...................................... 330/129; 330/279
(58) Field of Search .............................. 330/279, 129, 330/282, 285, 86

(56) References Cited

U.S. PATENT DOCUMENTS

| 4,924,190 | A |   | 5/1990 | Cooke |
| 5,339,454 | A |   | 8/1994 | Kuo et al. |
| 5,917,639 | A |   | 6/1999 | Ushirozawa |
| 6,055,094 | A |   | 4/2000 | Shima et al. |
| 6,246,285 | B1 | * | 6/2001 | Nishikido .................. 330/132 |
| 6,577,852 | B1 | * | 6/2003 | Iwata et al. .............. 455/240.1 |
| 6,708,025 | B2 | * | 3/2004 | Iwata et al. .............. 455/234.1 |

FOREIGN PATENT DOCUMENTS

| JP | 62-140507 | * | 6/1987 |
| JP | 2000151432 |   | 5/2000 |
| JP | 2000307363 |   | 11/2000 |

* cited by examiner

Primary Examiner—Henry Choe
(74) Attorney, Agent, or Firm—Swidler Berlin Shereff Friedman, LLP

(57) ABSTRACT

The invention concerns an amplifier circuit which comprises an amplifier unit (210) arranged to receive an input signal, to influence the amplification of this input signal and to transmit an output signal. The amplifier circuit also comprises a first control unit (210) and a second control unit (220). Those control units receive said output signal. Furthermore, the amplifier circuit comprises a selector unit (240) which is arranged to receive first and second control signals from the control units (310, 220). The selector unit (240) is arranged to control the amplification of the amplifier unit (201) in accordance with that one of said first and second control signals which gives the lowest amplification.

14 Claims, 3 Drawing Sheets

AMPLIFIER CIRCUIT

BACKGROUND OF THE INVENTION AND PRIOR ART

The present invention concerns an amplifier circuit comprising at least:

an amplifier unit arranged to receive an input signal and to influence the amplification of this input signal and to transmit an output signal which is intended to lie at a desired level, and a control unit arranged to sense said output signal and to deliver a first control signal for controlling the amplification of said amplifier unit.

U.S. Pat. No. 5,917,639 and U.S. Pat. No. 6,055,094 describe different kinds of known amplifier circuits.

An amplifier circuit may for example be used when it is desired that a signal should lie at a predetermined level. Such an amplifier circuit is often called AGC (Automatic Gain Control).

FIG. 1 shows an example of an already known circuit. The circuit comprises an amplifier unit 201. The amplifier unit receives an input signal at an input 202 and transmits an amplified output signal via an output 203. The level of the output signal is sensed by a level detector 211 which delivers an output signal which represents this level. The output signal from the level detector is conducted to an integrator unit 212 which integrates the difference between the output signal from the level detector 211 and a desired value, here represented by an input 214 of the integrator unit 212. The integrator unit 212 has an output 219 for the integrated signal. This integrated signal is conducted to a second input 204 of the amplifier unit 201. The signal at this second input 204 controls the amplification of the amplifier unit 201.

The amplifier unit 201 may for example be arranged such that a higher value of the signal at the second input 204 means a lower amplification. Of course also the opposite relationship is conceivable. If it is assumed that the output signal from the amplifier unit 201 lies higher than the predetermined level, the signal from the level detector 211 to the integrator unit 212 thus lies higher than the desired value 214. This means that the value of the signal at the output 219 of the integrator unit 212 increases, which means that the amplification of the amplifier unit 201 is reduced. The circuit according to FIG. 1 thus ensures that the output signal from the amplifier unit 201 lies at a predetermined level.

A disadvantage with prior known amplifier circuits is that it is often difficult to control the amplification for different kinds of signals. For example, some signals may comprise pulses of a very high frequency and other signals may comprise pulses with relatively long pauses between the pulses. When pulses arrive with long pauses between the pulses, the amplifier circuit may tend to amplify the signal, which may mean that when then pulses of a high frequency arrive, the amplification may be too high, which may lead to different problems, the amplifier may for example be saturated and the amplification may become non-linear.

SUMMARY OF THE INVENTION

A purpose of the present invention is to achieve an amplifier circuit which reduces or avoids the risk that a too high amplification is selected.

This purpose is achieved with an amplifier circuit of the kind which has been described in the first paragraph above and which is characterised by a second control unit arranged to sense said output signal and to deliver a second control signal for controlling the amplification of said amplifier unit, and a selector unit arranged to receive said first and second control signals and connected to said amplifier unit, wherein the selector unit is arranged to control the amplification of the amplifier unit in accordance with that one of said first and second control signals which gives the lowest amplification. Since the amplification is set in accordance with the control signal which gives the lowest amplification, the risk is reduced that a too high amplification is set when the control signals from the first and the second control unit differ.

According to a preferred embodiment of the invention, the first control unit is specially arranged to sense a first kind of output signal and the second control unit is specially arranged to sense a second kind of output signal. Hereby is in a simple manner achieved that the amplifier circuit takes different kinds of signals into account and ensures that a too high amplification, which could have been caused by some of the signals, is avoided.

According to a further embodiment, the first control unit is specially arranged to sense an output signal which is continuous or which comprises pulses with a relatively short pause between the pulses and the second control unit is specially arranged to sense an output signal which comprises pulses with relatively long pauses between the pulses. Through this embodiment the problem which has been discussed above is avoided, i.e. that a signal with relatively long pauses between the pulses may lead to a too high amplification. This is avoided since the second control unit is arranged to sense this kind of signal.

According to one embodiment, at least one of said control units comprises a level detector which detects which level said output signal has and an integrator unit which integrates the difference between the level of the output signal and a predetermined desired value, wherein the integrator unit has output connected to said selector unit. With such a control unit, known per se, the invention may be implemented in a simple manner.

According to a further embodiment, both the first and the second control units comprise a level detector and an integrator unit, wherein the desired value for the integrator unit of the second control unit is higher than the desired value for the integrator unit of the first control unit. A control unit which senses the signal with longer pauses may be less accurate than the control unit which is arranged to sense a signal with short pauses between the pulses. It may therefore be desirable that the signal which have longer pauses between the pulses does not control the amplification when the signal with shorter pauses between the pulses is present. This purpose is achieved with this embodiment. It is true that the second control unit will tend to deliver an output signal which means a higher amplification, but this does not cause any problem, since the selector unit controls the amplification in accordance with that control signals which gives the lowest amplification.

According to another embodiment, at least one of said control units comprises a comparator unit, which senses whether said output signal exceeds a predetermined level, and a signal control unit which has an output signal which, at least if a certain condition is fulfilled, changes in a first direction when the comparator unit senses an output signal exceeding the predetermined level, wherein the output signal from the signal control unit is connected to said selector unit and wherein said first direction means a reduced amplification of the amplifier unit if the signal from the signal control unit is conducted to the amplifier unit. This embodiment has been shown to bring about a well functioning control for certain kinds of signals.

According to a further embodiment, said condition is that said output signal which reaches the comparator unit and which exceeds the predetermined level has a frequency which exceeds a predetermined value. It is thereby made sure that the control unit in question delivers a control signal which corresponds to a reduced amplification if the pulses in question occur sufficiently often (with short pauses between the pulses).

According to an embodiment, said signal control unit is arranged such that when it does not receive any signal which leads to the fact that the output signal from the signal control unit changes in said first direction, then the signal control unit delivers an output signal which is conducted to the selector unit and which changes in the opposite direction to said first direction. With this embodiment of the invention, it has been shown that an optimal control of the amplification is achieved for certain kinds of signals.

According to another embodiment, the amplifier circuit comprises an A/D converter which converts a signal from the amplifier unit to a digital signal and a processor unit which treats said digital signal, wherein the processor unit is arranged to form at least a part of the control units and/or the selector unit. Since the control in this manner may be carried out by a digital signal, the invention may be realised in that the processor unit is arranged with a suitable program.

According to still another embodiment, the amplifier circuit comprises a D/A converter which converts an output signal from the processor unit to an analogue signal before this signal is conducted to the amplifier unit. The amplifier unit may thereby be controlled with an analogue signal. It should however be noted that there are also amplifier units which may be controlled with the help of a digital signal. For such an amplifier circuit this D/A converter is not necessary.

According to another embodiment, the amplifier circuit is arranged to receive an optical input signal and comprises a transducer which converts the optical signal to an electric signal before this signal as input signal is conducted to the amplifier unit. The amplifier circuit may thereby be used in connection with the amplification of an optical signal. Of course the circuit may also comprise a transducer which converts an electric output signal from the amplifier unit to an optical signal in order to for example transmit this amplified optical signal along a light conductor.

According to still another embodiment, the amplifier circuit comprises a third control unit arranged to sense said output signal and to deliver a third control signal for controlling the amplification of said amplifier unit, wherein the selector unit is arranged to receive also said third control signal and to control the amplification of the amplifier unit in accordance with that one of said first, second and third control signals which gives the lowest amplification. According to this embodiment a further improved control of the amplification is achieved.

According to a further embodiment, the third control unit is specially arranged to sense a third kind of output signal which differs from the first and the second kinds of output signals. The circuit may thus be arranged to sense more than two kinds of signals. Of course, the amplifier circuit may also comprise more than three control units.

According to still an embodiment, said selector unit comprises a plurality of diode units, wherein each diode unit has an input side arranged to receive a control signal from one of the control units, wherein each diode unit has an output and wherein the outputs from the diode units are connected to a common point. Through this embodiment, the selector unit may be realised in a simple manner. With a diode unit is here meant a diode or another unit which implements a diode function.

BRIEF DESCRIPTION OF THE DRAWINGS

The present invention will now be explained with the help of embodiments, given as examples, and with reference to the annexed drawings.

DETAILED DESCRIPTION OF EMBODIMENTS OF THE INVENTION

On the different figures the same reference signs are used for the corresponding parts. All these parts will therefore not be described in connection with each figure.

Figure 1:
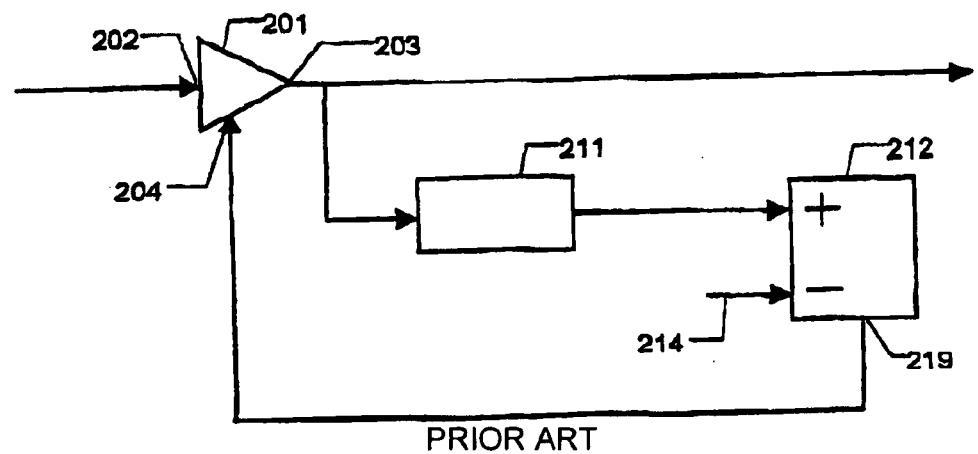
FIG. 1 shows schematically an amplifier circuit according to the prior art.
Figure 2:
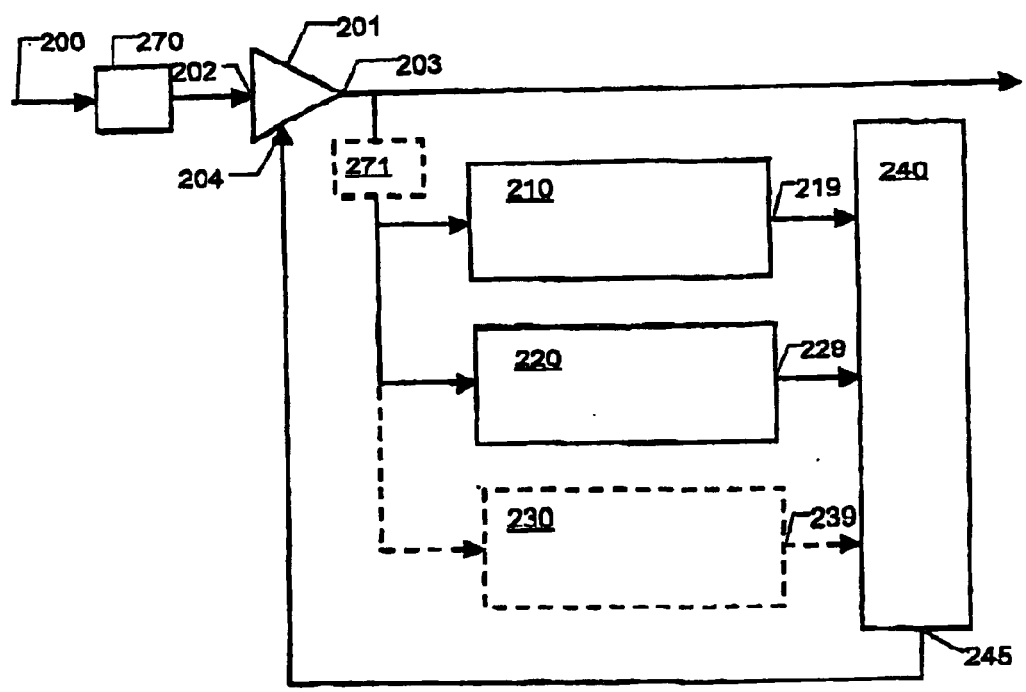
FIG. 2 shows schematically a first embodiment of the invention.

FIG. 2 shows an embodiment of the invention. According to the shown example, an optical signal is present on a conductor 200. The optical signal is converted into an electric signal with the help of a transducer 270. An electric signal from the transducer is conducted to an input 202 of an amplifier unit 201. This signal may either be in the form of a current or in the form of a voltage. The amplifier unit 201 is arranged to influence the amplification of this input signal and to transmit an output signal via an output 203. There may of course also be a unit which converts an electric output signal from the amplifier unit 201 to an optical signal before this signal is transmitted in an optical conductor.

It should be noted that by "amplification" is in this document also comprised the possibility that the signal is made weaker (amplification less than 1). This may be the case if the signal is in the form of a voltage, However, preferably a real amplification of the signal takes place.

It should also be noted that it is not always necessary that the optical signal is converted to an electric signal before the signal is amplified. The amplifier unit 201 may thus have both an optical input signal and an optical output signal. In this case there may suitably be a transducer 271 which converts the optical output signal to an electric signal before the signal is conducted to the control units 210, 220, 230 described below.

It is also possible that no optical signal at all reaches the amplifier circuit. In this case, the amplifier circuit is thus used to amplify electric signals.

The output signal from the output 203 is conducted to a first control unit 210 which is arranged to sense said output signal and to deliver a first control signal at an output 219. This first control signal is intended to control the amplification of the amplifier unit 201. The output signal from the output 203 is also conducted to a second control unit 220 which also is arranged to sense said output signal and to deliver a second control signal via an output 229. Also the second control signal is intended to control the amplification of the amplifier unit 201. The first control unit 210 is suitably specially arranged to sense a first kind of signal and the second control unit 220 is specially arranged to sense a second kind of signal. For example, the first control unit 210 may be arranged to sense an output signal which is continuous or which comprises pulses with a relatively short pause between the pulses and the second control unit 220 may be arranged to sense an output signal which comprises pulses with relatively long pauses between the pulses.

As an example of an application of the inventions, the amplification of optical signals may be mentioned. Such signals may be transmitted as square pulses of a certain frequency. For example, signals which transfer information may have a frequency of about 100 Mbit/s or 1 Gbit/s. Pulses may also arrive as, blocks with a frequency of about 10 Mbit/s. When no information is transferred, often so-called link-pulses (or "Idle-pulses") are transmitted. These pulses may for example have a frequency of about 100 Hz, thus an essentially lower frequency than the information carrying signals. For example, the first control unit 210 may thus be adapted to sense signals with the frequency 10 Mbit/s and faster, while the second control unit 220 is adapted to sense pulses with a frequency of 100 HZ.

The output signals from the outputs 219 and 229 are conducted to a selector unit 240 which has an output 245 from which a signal is conducted back to an input 204 of the amplifier unit 201 for controlling the amplification. The selector unit 240 is arranged to control the amplification of the amplifier unit 201 in accordance with that one of said first and second control signals which gives the lowest amplification.

The amplifier circuit may comprise an arbitrary number of control units adapted to the different kinds of signals which are the case. In FIG. 2 it is indicated with a hatched line a third control unit 230 arranged to via an output 239 deliver a third control signal to the selector unit 240. The selector unit 240 is arranged to control the amplification of the amplifier unit 201 in accordance with that one of said first, second and third control signals which gives the lowest amplification. The third control unit 230 is suitably specially arranged to sense a third kind of output signal which differs from the first and the second kinds of output signals.

Figure 3:
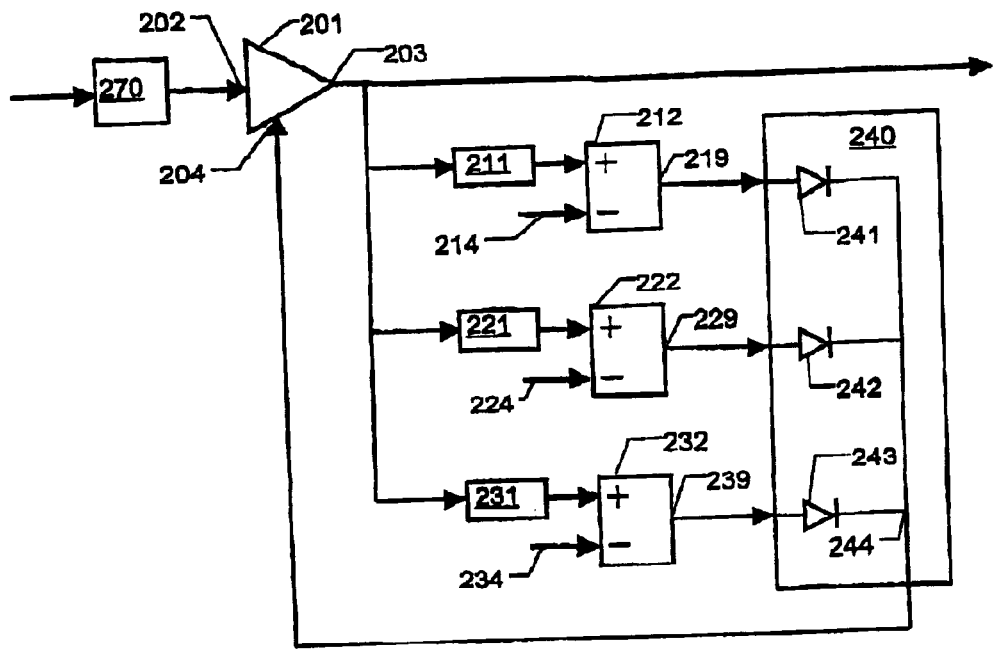
FIG. 3 shows a second embodiment of the invention.

FIG. 3 shows an embodiment with three control units where each control unit comprises a level detector 211, 221, 231 which detects which level said output signal has and an integrator unit 212, 222, 232 which integrates the difference between the detected level and a predetermined desired value 214, 224, 234. The outputs 219, 229, 239 from the integrator units 212 222, 232 are connected to the selector unit 240. Also in this case, the different control units are suitably arranged to sense different kinds of output signals. For example, one level detector may be adapted to sense signals with a relatively long pause between the pulses. Such a level detector may be arranged with a memory such that the level of a detected pulse is maintained as output signal from the level detector during a certain time.

The level of the signals may be defined in different manners depending on for which kind of signals the amplifier circuit is used. For example, the level may be an average value of the amplitude of the signal during a certain time interval. Alternatively, the level may be the maximum amplitude of the signal. According to a preferred embodiment, the level detectors may sense the peak-to-peak value of the signals.

As is symbolised with a + and − sign in FIG. 3, the integrator 212, 222, 232 integrates the difference between detected level and the desired value 214, 224, 234. The output signal of the integrator 212, 222, 232 thus increases as long as the detected level is higher than the desired value 214, 224, 234 and decreases if the detected level is lower than the desired value 214, 224, 234. For example, the amplifier unit 201 may be arranged such that a higher input signal on the control input 204 means a lower amplification and vice versa. The selector unit 240 selects the control signal which gives the lowest amplification, which according to this example means the highest control signal. According to a preferred embodiment, the selector unit 240 may comprise a plurality of diode units 241, 242, 243 connected in parallel. A diode unit may consist of a diode or of another unit which implements a diode function, for example a transistor connected such that the base corresponds to the anode of a diode and the emitter corresponds to the cathode of the diode. Each diode unit 241, 242, 243 has an input side arranged to receive a control signal from one of the control units 210, 220, 230, in this case thus from the integrators 212, 222, 232. The outputs from the diode units 241, 242, 243 are connected to a common point 244. The signal from this point is conducted to the input 204. Such a simple construction of the selector unit 240 functions if the input 204 is resistive such that always at least one of the diode units 241, 242, 243 has a forward voltage.

If one of the control units is arranged to sense signals with longer pauses between the pulses, for example the so-called link-pulses, it may sometimes be desirable that this control unit does not control the amplification during normal operation conditions. This may be achieved if the desired value for the integrator unit of this control unit is higher than the desired value for the integrator unit of the other control unit or control units. Through this higher desired value it is also avoided that a too low amplification is the case when only the signal with longer pauses between the pulses controls the amplification, which for example is the case when no other signals are present.

Figure 4:
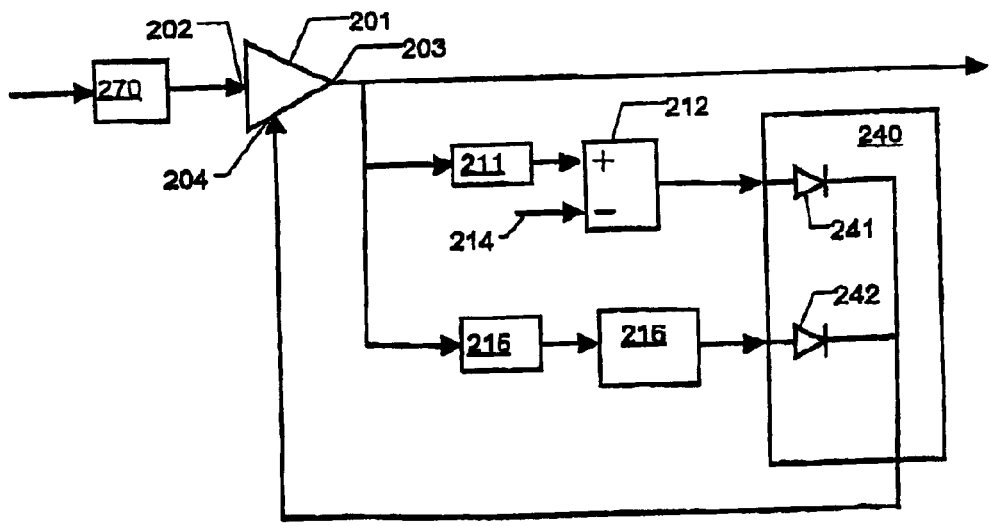
FIG. 4 shows a third embodiment of the invention.

FIG. 4 shows an embodiment which comprises different kinds of control units. A first control unit comprises a level detector 211 and an integrator unit 212 as has been described above. The amplifier circuit comprises a second control unit which comprises a comparator unit 215, which senses if the output signal from the amplifier unit 201 exceeds a predetermined level, and a signal control unit 216 which has an output signal which, at least if a certain condition is fulfilled, changes in a first direction when the comparator unit 215 senses an output signal exceeding the predetermined level. The output signal from the signal control unit 216 is connected to the selector unit 240. Said first direction means a decreased amplification of the amplifier unit 201 If the signal from the signal control unit 216 is conducted to the amplifier unit 201. In order to give a concrete example, it may be assumed that the amplifier unit 201 is such that a higher level of the signal to the input 204 means a lower amplification. Furthermore, the above mentioned condition may be that the signal should have a frequency which exceeds a certain value, for example 10 Hz. This example could for example be used for sensing the above mentioned link-pulses. The comparator unit may for example sense If the amplitude of the pulses exceeds 1.2 V. This means that if link-pulses with an amplitude over 1.2 V are sensed and if these pulses arrive with a higher frequency than 10 Hz, then the output signal from the signal control unit 216 is increased. This means a lower amplification. As mentioned, the selector unit 240 always selects the amplification in accordance with the output signal from the control unit which gives the lowest amplification.

The signal control unit 216 may for example be implemented as a unit which has an output signal which increases as soon as the comparator unit 215 receives a pulse exceeding the predetermined level, but continuously or discretely decreases (has a negative ramp) if no such signals are received. This means, according to this example, that the signal control unit 216 delivers a control signal which corresponds to an increased amplification as long as the comparator unit 215 does not receive any pulses above the predetermined level. For example, it may be assumed that the negative ramp is 100 mV/s and that the increased level is 10 mV/s when a pulse exceeding the predetermined level is received by the comparator unit 215. This thus means that if such pulses are received with a frequency which is higher than 10 Hz, then the signal control unit 216 delivers a control signal which corresponds to a reduced amplification. If however such pulses are received with a frequency which is lower than 10 Hz, then the signal control unit 216 delivers a control signal which corresponds to an increased amplification.

Figure 5:
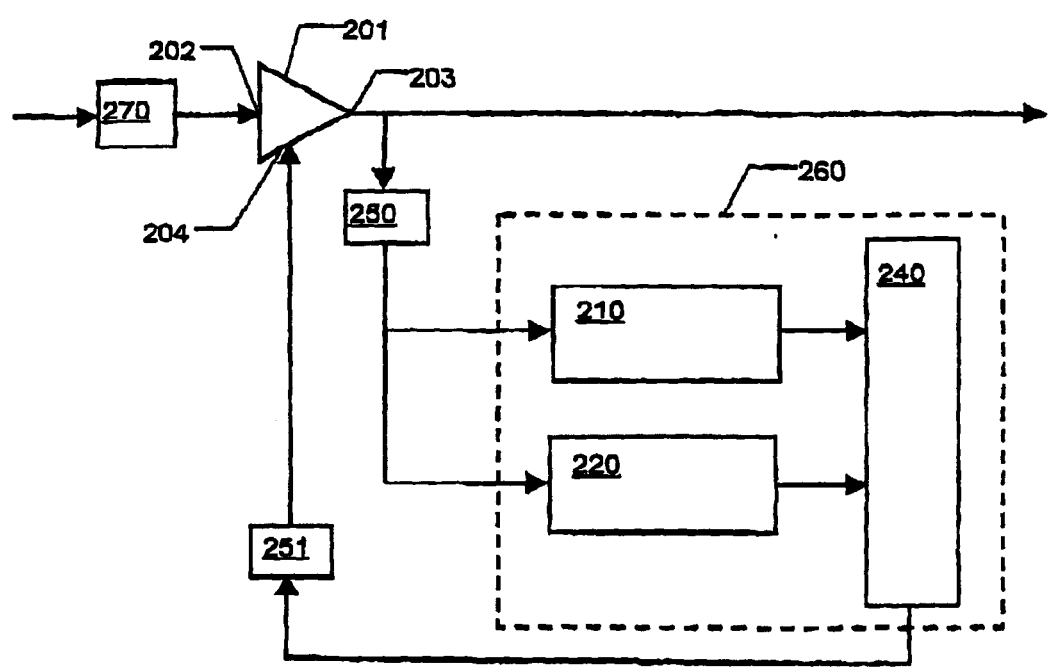
FIG. 5 shows a fourth embodiment of the invention.

The control units 210, 220, 230 or parts of these control units and/or the selector unit 240 may also be implemented with the help of a programmable processor unit 260. FIG. 5 Shows schematically an example of an amplifier circuit which comprises an A/D (analogue-digital) converter 250 which converts the output signal from the amplifier unit 201 to a digital signal. Furthermore, by 260 a processor unit is symbolised which treats this digital signal. The processor unit is arranged to form at least a part of the control units 210, 220, 230 and/or the selector unit 240. In the shown case, the whole control units 210, 220 and the selector unit 240 are formed by a processor unit 260. The amplifier circuit also comprises a D/A (digital-analogue) converter which converts an output signal from the processor unit 260 to an analogue form before this signal is conducted to the amplifier unit 201. This D/A converter is not necessary if the amplifier unit 201 may be controlled by a digital signal. It also conceivable that a certain electronic circuitry is present between the output 203 from the amplifier unit 201 and the A/D converter 250. For example, A/D conversion could also take place after possible level detectors. The whole control units do therefore not have to be implemented in the processor unit 260.

It should be noted that the amplifier circuit according to a preferred embodiment is arranged such that the amplification is limited such that it never exceeds a predetermined maximum level. This may for example be achieved in that the amplifier circuit is arranged such that a signal which corresponds to a maximum amplification is present at an input, suitably the input 204, of the amplifier unit 201, even if the output signal from the selector unit 240 corresponds to a higher amplification. According to an embodiment where a lower signal from the selector unit 240 means a higher amplification, this may for example be achieved in that the amplifier circuit is arranged such that always a minimum current (which corresponds to a maximum amplification) is conducted to the input 204. Alternatively, it is possible that the control units 210, 220, 230 are arranged such that the output signals from these control units are limited such that the amplification never exceeds a predetermined value.

In a corresponding manner as has been described in the preceding paragraph, it is also conceivable that the amplifier circuit is arranged such that the amplification always exceeds a predetermined minimum level.

The invention is not limited to the shown embodiments but may be varied and modified within the scope of the annexed claims.

What is claimed is:

1. An amplifier circuit comprising at least:
   an amplifier unit (201) arranged to receive an input signal and to influence the amplification of this input signal and to transmit an output signal which is intended to lie at a desired level,
   a first control unit arranged to detect said output signal and to deliver a first control signal for controlling the amplification of said amplifier unit, characterized by
   a second control unit arranged to sense said output signal and to deliver a second control signal for controlling the amplification of said amplifier unit,
   a selector unit arranged to receive said first and second control signals and connected to said amplifier unit, wherein the selector unit is arranged to control the amplification of the amplifier unit in accordance with that one of said first and second control signals which gives the lowest amplification.

2. An amplifier circuit according to claim 1, wherein the first control unit is specially arranged to sense a first kind of output signal and wherein the second control unit is specially arranged to sense a second kind of output signal.

3. An amplifier circuit according to claim 2, wherein the first control unit is specially arranged to sense an output signal which is continuous or which comprises pulses with a relatively short pause between the pulses and wherein the second control unit is specially arranged to sense an output signal which comprises pulses with relatively long pauses between the pulses.

4. An amplifier circuit according to claim 1, wherein at least one of said control units comprises a level detector which detects which level said output signal has and an integrator unit which integrates the difference between the level of the output signal and a predetermined desired value, wherein the integrator unit has an output connected to said selector unit.

5. An amplifier circuit according to claim 4, wherein both the first and the second control units comprise a level detector and an integrator unit as has been defined in claim 4, and wherein the desired value for the integrator unit of the second control unit is higher than the desired value for the integrator unit of the first control unit.

6. An amplifier circuit according to claim 1, wherein at least one of said control units comprises a comparator unit, which senses whether said output signal exceeds a predetermined level, and a signal control unit which has an output signal which, at least if a certain condition is fulfilled, changes in a first direction when the comparator unit senses an output signal exceeding the predetermined level, wherein the output signal from the signal control unit is connected to said selector unit and wherein said first direction means a reduced amplification of the amplifier unit if the signal from the signal control unit is conducted to the amplifier unit.

7. An amplifier circuit according to claim 6, wherein said condition is that said signal which reaches the comparator unit and which exceeds the predetermined level has a frequency which exceeds a predetermined value.

8. An amplifier circuit according to claim 6, wherein said signal control unit is arranged such that when it does not receive any signal which leads to the fact that the output signal from the signal control unit changes in said first direction, the signal control unit delivers an output signal which is conducted to the selector unit and which changes in the opposite direction to said first direction.

9. An amplifier circuit according to claim 1, comprising an A/D converter which converts a signal from the amplifier unit to a digital signal and a processor unit which treats said digital signal, wherein the processor unit is arranged to form at least a part of the control units and/or the selector unit.

10. An amplifier circuit according to claim 9, comprising a D/A converter which converts an output signal from the processor unit to an analogue signal before this signal is conducted to the amplifier unit.

11. An amplifier circuit according to claim 1, arranged to receive an optical input signal and comprising a transducer which converts the optical signal to an electric signal before this signal as input signal is conducted to the amplifier unit.

12. An amplifier circuit according to claim 1, comprising a third control unit arranged to sense said output signal and to deliver a third control signal for controlling the amplification of said amplifier unit, wherein the selector unit is arranged to receive also said third control signal and to control the amplification of the amplifier unit in accordance with that one of said first, second and third control signals which gives the lowest amplification.

13. An amplifier circuit according to claim 12, wherein the third control unit is specially arranged to sense a third kind of output signal which differs from the first and the second kinds of output signals.

14. An amplifier circuit according to claim 1, wherein said selector unit comprises a plurality of diode units, wherein each diode unit has an input side arranged to receive a control signal from one of the control units, wherein each diode unit has an output and wherein the outputs from the diode units are connected to a common point.

* * * * *